(12) United States Patent
Dory et al.

(10) Patent No.: US 10,752,867 B2
(45) Date of Patent: Aug. 25, 2020

(54) CLEANING COMPOSITIONS

(71) Applicant: Fujifilm Electronic Materials U.S.A., Inc., N. Kingstown, RI (US)

(72) Inventors: Thomas Dory, Gilbert, AZ (US); Mick Bjelopavlic, Chandler, AZ (US); Joshua Guske, Mesa, AZ (US); Kazutaka Takahashi, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 16/278,875

(22) Filed: Feb. 19, 2019

(65) Prior Publication Data

US 2019/0300825 A1    Oct. 3, 2019

Related U.S. Application Data

(60) Provisional application No. 62/649,029, filed on Mar. 28, 2018.

(51) Int. Cl.
| | | |
|---|---|---|
| *C11D 7/32* | (2006.01) | |
| *C11D 7/06* | (2006.01) | |
| *H01L 21/02* | (2006.01) | |
| *C11D 7/34* | (2006.01) | |
| *C11D 7/26* | (2006.01) | |

(52) U.S. Cl.
CPC .............. *C11D 7/3281* (2013.01); *C11D 7/06* (2013.01); *C11D 7/261* (2013.01); *C11D 7/34* (2013.01); *H01L 21/02043* (2013.01)

(58) Field of Classification Search
CPC .................................................. C11D 11/0047
USPC ........................................................ 510/175
See application file for complete search history.

(56) References Cited

U.S. PATENT DOCUMENTS

| | | |
|---|---|---|
| 6,602,440 B2 | 8/2003 | Bishop et al. |
| 2006/0205623 A1 | 9/2006 | Oowada et al. |
| 2014/0109931 A1 | 4/2014 | Lee et al. |
| 2015/0162213 A1* | 6/2015 | Chen .......................... C23F 1/28 438/754 |
| 2016/0179011 A1 | 6/2016 | Agarwal et al. |

OTHER PUBLICATIONS

International Search Report and Written Opinion of the International Searching Authority for International Application No. PCT/US19/18508 dated May 3, 2019.

* cited by examiner

*Primary Examiner* — Gregory E Webb
(74) *Attorney, Agent, or Firm* — Fish & Richardson P.C.

(57) ABSTRACT

This disclosure relates to a cleaning composition that contains 1) at least one redox agent; 2) at least one alkylsulfonic acid or a salt thereof, the alkylsulfonic acid containing an alkyl group substituted by OH or $NH_2$; 3) at least one aminoalcohol; 4) at least one corrosion inhibitor; 5) at least one water soluble organic solvent; 6) water; and 7) optionally, at least one pH adjusting agent.

24 Claims, No Drawings

CLEANING COMPOSITIONS

CROSS-REFERENCE TO RELATED APPLICATION

The present application claims priority to U.S. Provisional Application Ser. No. 62/649,029, filed on Mar. 28, 2018, the contents of which are hereby incorporated by reference in their entirety.

TECHNICAL FIELD

The present disclosure relates to novel cleaning compositions for semiconductor substrates and methods of cleaning semiconductor substrates. More particularly, the present disclosure relates to cleaning compositions for semiconductor substrates after plasma etching of metal layers or dielectric material layers deposited on the substrates and the removal of residues left on the substrates after bulk resist removal via a plasma ashing process.

BACKGROUND

In the manufacture of integrated circuit devices, photoresists are used as an intermediate mask for transferring the original mask pattern of a reticle onto the wafer substrate by means of a series of photolithography and plasma etching steps. One of the essential steps in the integrated circuit device manufacturing process is the removal of the patterned photoresist films from the wafer substrate. In general, this step is carried out by one of two methods.

One method involves a wet stripping step in which the photoresist-covered substrate is brought into contact with a photoresist stripper solution that consists primarily of an organic solvent and an amine. However, such stripper solutions generally cannot completely and reliably remove the photoresist films, especially if the photoresist films have been exposed to UV radiation and plasma treatments during fabrication. Some photoresist films become highly cross-linked by such treatments and are more difficult to dissolve in a stripper solution. In addition, the chemicals used in these conventional wet-stripping methods are sometimes ineffective for removing inorganic or organometallic residual materials formed during the plasma etching of metal or oxide layers with halogen-containing gases.

An alternative method of removing a photoresist film involves exposing a photoresist-coated wafer to oxygen-based plasma in order to burn the resist film from the substrate in a process known as plasma ashing. However, plasma ashing is also not fully effective in removing the plasma etching by-products noted above. Instead, removal of these plasma etch by-products is typically accomplished by subsequently exposing the processed metal and dielectric thin films to certain cleaning solutions.

Metal-containing substrates are generally susceptible to corrosion. For example, substrates such as aluminum, copper, aluminum-copper alloy, tungsten nitride, tungsten, cobalt, titanium oxide, other metals and metal nitrides, will readily corrode. Further, dielectrics (e.g., interlayer dielectrics or ultra low-k dielectrics) in the integrated circuit devices can be etched by using conventional cleaning chemistries. In addition, the amount of corrosion tolerated by the integrated circuit device manufacturers is getting smaller and smaller as the device geometries shrink.

At the same time, as residues become harder to remove and corrosion must be controlled to ever lower levels, cleaning solutions should be safe to use and environmentally friendly.

Therefore, the cleaning solutions should be effective for removing the plasma etch and plasma ashing residues and should also be non-corrosive to all exposed substrate materials.

SUMMARY

The present disclosure is directed to non-corrosive cleaning compositions that are useful for removing residues (e.g., plasma etch and/or plasma ashing residues) from a semiconductor substrate as an intermediate step in a multistep manufacturing process. These residues include a range of relatively insoluble mixtures of organic compounds such as residual photoresist; organometallic compounds; metal oxides such as aluminum oxides (AlOx), titanium oxides (TiOx), zirconium oxides (ZrOx), tantalum oxides (TaOx), and hafnium oxides (HfOx) (which can be formed as reaction by-products from exposed metals); metals such as aluminum (Al), aluminum/copper alloy, copper (Cu), titanium (Ti), tantalum (Ta), tungsten (W), and cobalt (Co); metal nitrides such as aluminum nitrides (AlN), aluminum oxide nitrides (AlOxNy), titanium nitrides (TiN), tantalum nitrides (TaN), and tungsten nitrides (WN); their alloys; and other materials. An advantage of the cleaning composition described herein is that it can clean a broad range of residues encountered and be generally non-corrosive to exposed substrate materials (e.g., exposed metal oxides (such as AlOx), metals (such as aluminum, aluminum/copper alloy, copper, titanium, tantalum, tungsten, and cobalt), metal nitrides (such as titanium, tantalum, and tungsten nitrides), and their alloys).

In one aspect, the present disclosure features a cleaning composition comprising (e.g., consisting of or consisting essentially of): 1) at least one redox agent; 2) at least one alkylsulfonic acid or a salt thereof, the alkylsulfonic acid comprising an alkyl group substituted by OH or $NH_2$; 3) at least one aminoalcohol; 4) at least one corrosion inhibitor; 5) at least one organic solvent; 6) water; and 7) optionally, at least one pH adjusting agent.

In another aspect, the present disclosure features a cleaning composition comprising (e.g., consisting of or consisting essentially of): 1) at least one redox agent; 2) at least one aminoalcohol; 3) at least one corrosion inhibitor; 4) at least one organic solvent; 5) water; and 6) optionally, at least one pH adjusting agent.

In another aspect, the present disclosure features a method of cleaning residues from a semiconductor substrate. The method includes contacting a semiconductor substrate containing post etch residues and/or post ash residues with a cleaning composition described herein. For example, the method can include the steps of: (A) providing a semiconductor substrate containing post etch and/or post ash residues; (B) contacting said semiconductor substrate with a cleaning composition described herein; (C) rinsing said semiconductor substrate with a suitable rinse solvent; and (D) optionally, drying said semiconductor substrate by any means that removes the rinse solvent and does not compromise the integrity of said semiconductor substrate.

The details of one or more embodiments of the invention are set forth in the description below. Other features, objects, and advantages of the invention will be apparent from the description and the claims.

DETAILED DESCRIPTION

As defined herein, unless otherwise noted, all percentages expressed should be understood to be percentages by weight to the total weight of the cleaning composition. Unless otherwise noted, ambient temperature is defined to be between about 16 and about 27 degrees Celsius (° C.), such as 25° C.

As used herein, the terms "layer" and "film" are used interchangeably.

As defined herein, a "water-soluble" substance (e.g., a water-soluble alcohol, ketone, ester, or ether) refers to a substance having a solubility of at least 0.1% by weight in water at 25° C.

In general, the present disclosure is directed to a cleaning composition (e.g., a non-corrosive cleaning composition) including: 1) at least one redox agent; 2) at least one alkylsulfonic acid or a salt thereof, the alkylsulfonic acid comprising an alkyl group substituted by OH or $NH_2$; 3) at least one aminoalcohol; 4) at least one corrosion inhibitor; 5) at least one organic solvent (e.g., at least one water soluble organic solvent selected from the group consisting of water soluble alcohols, water soluble ketones, water soluble esters, and water soluble ethers); 6) water; and 7) optionally, at least one pH adjusting agent.

In some embodiments, the compositions of this disclosure contain at least one (e.g., two, three, or four) redox agent, which is believed to aid in the dissolution of residues on the semiconductor surface such as photoresist residues, metal residues, and metal oxide residues. As used herein, the term "redox agent" refers to a compound that can induce an oxidation and/or a reduction in a semiconductor cleaning process. An example of a suitable redox agent is hydroxylamine. In some embodiments, the redox agent or the cleaning composition described herein does not include a peroxide (e.g., hydrogen peroxide).

In some embodiments, the at least one redox agent can be at least about 6% by weight (e.g., at least about 7% by weight, at least about 8% by weight, at least about 9% by weight, at least about 10% by weight, at least about 11% by weight, or at least about 12% by weight) and/or at most about 15% by weight (e.g., at most about 14% by weight, at most about 13% by weight, at most about 12% by weight, at most about 11% by weight, or at most about 10% by weight) of the cleaning compositions of this disclosure.

In some embodiments, the cleaning compositions of this disclosure include the at least one (e.g., two, three, or four) alkylsulfonic acid or a salt thereof, the alkylsulfonic acid containing an alkyl group substituted by OH or $NH_2$. In some embodiments, the at least one alkylsulfonic acid includes an alkylsulfonic acid of formula (I):

$$R—SO_3H \quad\quad (I),$$

in which R is $C_1$-$C_{10}$ alkyl substituted by at least one substituent selected from the group consisting of OH and $NH_2$. In some embodiment, R is $C_1$-$C_4$ alkyl substituted by at least one OH. For example, the at least one alkylsulfonic acid or a salt thereof (e.g., a salt free of metal ions such as alkali metal ions) can include $HO(CH_2)_2SO_3H$ or $HO(CH_2)_2SO_3NH_4$. In some embodiments, the cleaning compositions of this disclosure do not contain the above alkylsulfonic acid or a salt thereof (e.g., an salt containing a metal ion such as an alkali metal ion).

In some embodiments, the at least one alkylsulfonic acid or a salt thereof can be at least about 0.3% by weight (e.g., at least about 0.4% by weight, at least about 0.5% by weight, at least about 0.6% by weight, at least about 0.7% by weight, at least about 0.8% by weight, at least about 0.9% by weight, at least about 1% by weight, at least about 1.5% by weight, or at least about 2% by weight) and/or at most about 5% by weight (e.g., at most about 4% by weight, at most about 3% by weight, at most about 2% by weight, at most about 1.5% by weight, at most about 1.2% by weight, or at most about 1% by weight) of the cleaning compositions of this disclosure. Without wishing to be bound by theory, it is believed that a cleaning composition including the alkylsulfonic acid or a salt thereof in the amount specified above can reduce the corrosion effects of the composition on certain exposed substrate materials (e.g., AlOx) that are not intended to be removed during the cleaning process (e.g., by lowering the etch rates of the cleaning composition on such exposed substrate materials).

In some embodiments, the cleaning compositions of this disclosure contain at least one (e.g., two, three, or four) aminoalcohol. As used herein, the term "aminoalcohol" refers to a compound that include at least one (e.g., two, three, or four) amino group and at least one (e.g., two, three, or four) hydroxyl group. In some embodiments, the aminoalcohol can be a compound of formula (I): $H_2N—R—OH$ (I), in which R is $C_1$-$C_6$ straight or branched alkylene or oxyalkylene. Examples of suitable aminoalcohols include ethanolamine and 2-(2-aminoethoxy)ethanol.

In some embodiments, the at least one aminoalcohol can be at least about 5% by weight (e.g., at least about 5.5% by weight, at least about 6% by weight, at least about 6.5% by weight, at least about 7% by weight, or at least about 7.5% by weight) and/or at most about 10% by weight (e.g., at most about 9.5% by weight, at most about 9% by weight, at most about 8.5% by weight, or at most about 8% by weight) of the cleaning compositions of this disclosure. Without wishing to be bound by theory, it is believed that the aminoalcohols can aid in the dissolution of residues on the semiconductor surface (such as photoresist residues, metal residues, and metal oxide residues) by, for example, serving as an oxidizing agent, hydrogen bonding with hydroxylamine to make it more effective in the cleaning compositions, swelling/dissolving the etch residue, or a combination of the above mechanisms.

In some embodiments, the cleaning compositions of this disclosure contain at least one (e.g., two, three, or four) corrosion inhibitor. In some embodiments, the corrosion inhibitors can be selected from substituted or unsubstituted benzotriazoles. Without wishing to be bound by theory, it is believed that such cleaning compositions can exhibit significantly improved compatibility with materials (e.g., AlOx or Co) that may be present in the semiconductor substrate and should not be removed by the cleaning compositions, when compared to cleaning compositions without any corrosion inhibitor.

Suitable classes of substituted benzotriazole include, but are not limited to, benzotriazoles substituted by at least one substituent selected from the group consisting of alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable examples of as a corrosion inhibitor include, but are not limited to, benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-n itrobenzotriazole, 4-n itrobenzotriazole, 3-amino-5-mercapto-1,2,4-triazole, 2-(5-amino-pentyl)-benzotriazole, 1-amino-benzotriazole, 5-methylbenzotriazole, benzotriazole-5-carboxylic acid, 4-m ethylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-m ethoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

In some embodiments, the at least one corrosion inhibitor can be at least about 0.1% by weight (e.g., at least about 0.2% by weight, at least about 0.3% by weight, at least about 0.4% by weight, or at least about 0.5% by weight) and/or at most about 2% by weight (e.g., at most about 1.8% by weight, at most about 1.6% by weight, at most about 1.4% by weight, at most about 1.2% by weight, or at most about 1% by weight) of the cleaning compositions of this disclosure.

In some embodiments, the cleaning compositions of this disclosure contain at least one (e.g., two, three, four, or more) organic solvent, e.g., at least one water soluble organic solvent selected from the group consisting of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and low molecular weight alcohols containing a ring structure. Examples of water soluble alkane diols includes, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols. Examples of water soluble alkylene glycols include, but are not limited to, ethylene glycol, propylene glycol, hexylene glycol, diethylene glycol, dipropylene glycol, triethylene glycol and tetraethylene glycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers. Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

Examples of water soluble ketones include, but are not limited to, acetone, cyclobutanone, cyclopentanone, diacetone alcohol, 2-butanone, 2,5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters such as ethylene glycol monoacetate, diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethylether acetate.

In some embodiments, the at least one organic solvent can be at least about 30% by weight (e.g., at least about 35% by weight, at least about 40% by weight, or at least about 45% by weight) and/or at most about 50% by weight (e.g., at most about 45% by weight, at most about 40% by weight, or at most about 30% by weight) of the cleaning compositions of this disclosure.

The cleaning compositions of the present disclosure further include water. Preferably, the water is de-ionized and ultra-pure, contains no organic contaminants and has a minimum resistivity of about 4 to about 17 mega Ohms. More preferably, the resistivity of the water is at least 17 mega Ohms.

In some embodiments, water can be at least about 20% by weight (e.g., at least about 25% by weight, at least about 30% by weight, at least about 35% by weight, or at least about 40% by weight) and/or at most about 50% by weight (e.g., at most about 45% by weight, at most about 40% by weight, at most about 35% by weight, or at most about 30% by weight) of the cleaning compositions of this disclosure.

In some embodiments, the cleaning compositions of this disclosure can optionally contain at least one pH adjusting agent (e.g., an acid or a base) to control the pH to from about 8 to about 11. In some embodiments, the compositions of this disclosure can have a pH of at least about 8 (e.g., at least about 8.5, at least about 9, at least about 9.5, or at least about 10) to at most about 11 (e.g., at most about 10.5, at most about 10, at most about 9.5, or at most about 9). Without wishing to be bound by theory, it is believed that a cleaning composition having a pH lower than 8 or higher than 11 would increase the etch rate of certain metals or dielectric materials to an undesirable level. The effective pH can vary depending on the types and amounts of the ingredients used in the cleaning compositions described herein.

The amount of the pH adjusting agent required, if any, can vary as the concentrations of the other components (e.g., the hydroxylamine, the alkylsulfonic acid, the aminoalcohol, and the corrosion inhibitor) are varied in different formulations, and as a function of the molecular weight of the particular pH adjusting agent employed. In general, the pH adjusting agent concentration ranges from about 1% to about 10% by weight of the cleaning composition. In some embodiments, the cleaning compositions of this disclosure include at least about 1% by weight (e.g., at least about 1.5% by weight, at least about 2% by weight, or at least about 2.5% by weight) and/or at most about 10% by weight (e.g., at most about 9% by weight, at most about 8% by weight, at most about 7% by weight, at most about 6% by weight, or at most about 5% by weight) the pH adjusting agent.

In some embodiments, the pH adjusting agent is free of any metal ion (except for a trace amount of metal ion impurities). Suitable metal ion free pH adjusting agents include acids and bases. Suitable acids that can be used as a pH adjusting agent include carboxylic acids and sulfonic acids. Exemplary carboxylic acid include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, or α-hydroxyacids and β-hydroxyacids of tricarboxylic acids. In some embodiments, the at least one carboxylic acid includes citric acid, maleic acid, fumaric acid, lactic acid, glycolic acid, oxalic acid, tartaric acid, succinic acid, or benzoic acid. Examples of sulfonic acids of include, but are not limited to, methanesulfonic acid, trifluoromethanesulfonic acid, ethanesulfonic acid, trifluoroethanesulfonic acid, perfluoroethylsulfonic acid, perfluoro(ethoxyethane)sulfonic acid, perfluoro(methoxyethane)sulfonic acid, dodecylsulfonic acid, perfluorododecylsulfonic acid, butanesulfonic acid, perfluorobutanesulfonic acid, propanesulfonic acid, perfluoropropanesulfonic acid, octylsulfonic acid, pefluorooctanesulfonic acid, methanedisulfonic acid, 2-methylpropanesulfonic acid, cyclohexylsulfonic acid, camphorsulfonic acids, perfluorohexanesulfonic acid, ethanedisulfonic acid, benzylsulfonic acid, hydroxyphenylmethanesulfonic acid, naphthylmethanesulfonic acid, and norbornanesulfonic acids. benzenesulfonic acid, chlorobenzenesulfonic acids, bromobenzenesulfonic acids, fluorobenzenesulfonic acids, hydroxybenzenesulfonic acids, nitrobenzenesulfonic acids, 2-hydroxy-5-sulfobenzoic acid, benzenedisulfonic acids, toluenesulfonic acids (e.g., p-toluenesulfonic acid), methylchlorobenzenesulfonic acids, dodecylbenzenesulfonic acids, butylbenzenesulfonic acids, cyclohexylbenzenesulfonic acids, picrylsulfonic acid, dichlorobenzenesulfonic acids, dibromobenzenesulfonic acids, and 2,4,5-trichlorobenzenesulfonic acid.

Suitable bases that can be used as a pH adjusting agent include ammonium hydroxide, quaternary ammonium hydroxides, monoamines (including alkanolamines), imines (such as 1,8-diazabicyclo[5.4.0]-7-undecene (DBU) and 1,5-diazabicyclo[4.3.0]-5-nonene), and guanidine salts (such as guanidine carbonate). Examples of suitable quaternary ammonium hydroxides include, but are not limited to, tetramethyl ammonium hydroxide, tetraethyl ammonium hydroxide, tetrapropyl ammonium hydroxide, tetrabutyl ammonium hydroxide, dimethyldiethylammonium hydroxide, choline, tetraethanolammonium hydroxide, benzyltrimethylammonium hydroxide, benzyltriethylammonium hydroxide, and benzyltributylammonium hydroxide. Examples of suitable monoamines include, but are not limited to, triethylamine, tributylamine, tripentylamine, ethanolamine, diethanolamine, diethylamine, butylamine, dibutylamine, and benzylamine.

In addition, in some embodiments, the cleaning compositions of the present disclosure may contain additives such as, additional pH adjusting agents, additional corrosion inhibitors, additional organic solvents, surfactants, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference).

In some embodiments, the cleaning compositions of the present disclosure may specifically exclude one or more of the additive components, in any combination, if more than one. Such components are selected from the group consisting of polymers, oxygen scavengers, quaternary ammonium salts including quaternary ammonium hydroxides, amines, alkaline bases (such as NaOH, KOH, LiOH, Mg(OH)$_2$, and Ca(OH)$_2$), surfactants other than a defoamer, a defoamer, fluoride-containing compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids (e.g., those lacking amino groups), silanes (e.g., alkoxysilanes), cyclic compounds (e.g., cyclic compounds containing at least two rings, such as substituted or unsubstituted naphthalenes, or substituted or unsubstituted biphenylethers), chelating agents, non-azole corrosion inhibitors, buffering agents, guanidine, guanidine salts, acids such as organic acids and inorganic acids (e.g., sulfonic acids, sulfuric acid, sulfurous acid, nitrous acid, nitric acid, phosphorous acid, and phosphoric acid), pyrrolidone, polyvinyl pyrrolidone, metal salts (e.g., metal halides such as metal halides of the formula $W_zMX_y$, wherein W is selected from H, an alkali or alkaline earth metal, and a metal-ion-free hydroxide base moiety; M is a metal selected from the group consisting of Si, Ge, Sn, Pt, P, B, Au, Ir, Os, Cr, Ti, Zr, Rh, Ru and Sb; y is from 4 to 6; and z is 1, 2, or 3), and corrosion inhibitors other than those described in this disclosure.

The cleaning compositions described herein can be prepared by simply mixing the components together, or can be prepared by blending two compositions in a kit.

In some embodiments, the cleaning compositions of the present disclosure are not specifically designed to remove bulk photoresist films from semiconductor substrates. Rather, the cleaning compositions of the present disclosure can be designed to remove all residues after bulk resist removal by dry or wet stripping methods. Therefore, in some embodiments, the cleaning method of the present disclosure is preferably employed after a dry or wet photoresist stripping process. This photoresist stripping process is generally preceded by a pattern transfer process, such as an etch or implant process, or it is done to correct mask errors before pattern transfer. The chemical makeup of the residue will depend on the process or processes preceding the cleaning step.

Any suitable dry stripping process can be used to remove bulk resist from semiconductor substrates. Examples of suitable dry stripping processes include oxygen based plasma ashing, such as a fluorine/oxygen plasma or a $N_2/H_2$ plasma; ozone gas phase-treatment; fluorine plasma treatment, hot $H_2$ gas treatment (such as that described in U.S. Pat. No. 5,691,117 incorporated herein by reference in its entirety), and the like. In addition, any conventional organic wet stripping solution known to a person skilled in the art can be used to remove bulk resist from semiconductor substrates.

A preferred stripping process used in combination with the cleaning method of the present disclosure is a dry stripping process. Preferably, this dry stripping process is the oxygen based plasma ashing process. This process removes most of the photoresist from the semiconductor substrate by applying a reactive-oxygen atmosphere at elevated temperatures (typically 250° C.) at vacuum conditions (i.e., 1 torr).

Organic materials are oxidized by this process and are removed with the process gas. However, this process generally does not remove all inorganic or organometallic contamination from the semiconductor substrate. A subsequent cleaning of the semiconductor substrate with the cleaning composition of the present disclosure is typically necessary to remove those residues.

In some embodiments, the present disclosure features methods of cleaning residues from a semiconductor substrate. Such methods can be performed, for example, by contacting a semiconductor substrate containing post etch residues and/or post ash residues with a cleaning composition described herein. The method can further include rinsing the semiconductor substrate with a rinse solvent after the contacting step and/or drying the semiconductor substrate after the rinsing step. In some embodiments, the semiconductor substrate can further include at least one material (e.g., an exposed material) or a layer of the at least one material, where the material is selected from the group consisting of Cu, Co, W, AlOx, AlN, AlOxNy, Ti, TiN, Ta, TaN, TiOx, ZrOx, HfOx, and TaOx.

In some embodiments, the cleaning method includes the steps of: (A) providing a semiconductor substrate containing post etch and/or post ash residues; (B) contacting said semiconductor substrate with a cleaning composition described herein; (C) rinsing said semiconductor substrate with a suitable rinse solvent; and (D) optionally, drying said semiconductor substrate by any suitable means that removes the rinse solvent and does not compromise the integrity of said semiconductor substrate. In some embodiments, the cleaning method further includes forming a semiconductor device (e.g., an integrated circuit device such as a semiconductor chip) from the semiconductor substrate obtained by the method described above.

In some embodiments, the cleaning method does not substantially remove CO, aluminum oxides (AlOx or $Al_2O_3$), silicon oxides (SiOx), zirconium oxide (ZrOx), TiN, SiN, poly-Si, or Cu in the semiconductor substrate. For example, in some embodiments, the method removes no more than about 5% by weight (e.g., no more than about 3% by weight, no more than about 1% by weight, no more than about 0.5% by weight, or no more than about 0.1% by weight) of any of the above materials in the semiconductor substrate.

The semiconductor substrates to be cleaned in this method can contain organic and organometallic residues, and additionally, a range of metal oxides that need to be removed. Semiconductor substrates typically are constructed of silicon, silicon germanium, Group III-V compounds like GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, and silicon, titanium nitride, tantalum nitride, tungsten, and their alloys. The semiconductor substrate can also contain layers of interlayer dielectrics, silicon oxide, silicon nitride, silicon carbide, titanium oxide, and carbon doped silicon oxides.

The semiconductor substrate can be contacted with a cleaning composition by any suitable method, such as placing the cleaning composition into a tank and immersing and/or submerging the semiconductor substrates into the cleaning composition, spraying the cleaning composition onto the semiconductor substrate, streaming the cleaning composition onto the semiconductor substrate, or any combinations thereof. Preferably, the semiconductor substrates are immersed into the cleaning composition.

The cleaning compositions of the present disclosure may be effectively used up to a temperature of about 90° C. (e.g., from about 25° C. to about 80° C., from about 30° C. to about 60° C., or from about 40° C. to about 60° C.).

Similarly, cleaning times can vary over a wide range depending on the particular cleaning method and temperature employed. When cleaning in an immersion batch type process, a suitable time range is, for example, up to about 60 minutes (e.g., from about 1 minute to about 60 minutes, from about 3 minutes to about 20 minutes, or from about 4 minutes to about 15 minutes).

Cleaning times for a single wafer process may range from about 10 seconds to about 5 minutes (e.g., from about 15 seconds to about 4 minutes, from about 15 seconds to about 3 minutes, or from about 20 seconds to about 2 minutes).

To further promote the cleaning ability of the cleaning composition of the present disclosure, mechanical agitation means can be employed. Examples of suitable agitation means include circulation of the cleaning composition over the substrate, streaming or spraying the cleaning composition over the substrate, and ultrasonic or megasonic agitation during the cleaning process. The orientation of the semiconductor substrate relative to the ground may be at any angle. Horizontal or vertical orientations are preferred.

The cleaning compositions of the present disclosure can be used in conventional cleaning tools known to those skilled in the art. A significant advantage of the compositions of the present disclosure is that they include relatively non-toxic, non-corrosive, and non-reactive components in whole and in part, whereby the compositions are stable in a wide range of temperatures and process times. The compositions of the present disclosure are chemically compatible with practically all materials used to construct existing and proposed semiconductor wafer cleaning process tools for batch and single wafer cleaning.

Subsequent to the cleaning, the semiconductor substrate can be rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, aqueous rinses with pH >8 (such as dilute aqueous ammonium hydroxide) may be employed. Preferred examples of rinse solvents include, but are not limited to, dilute aqueous ammonium hydroxide, DI water, methanol, ethanol and isopropyl alcohol. The solvent may be applied using means similar to that used in applying a cleaning composition described herein. The cleaning composition may have been removed from the semiconductor substrate prior to the start of the rinsing step or it may still be in contact with the semiconductor substrate at the start of the rinsing step. Preferably, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Marangoni drying, Rotagoni drying, IPA drying or any combinations thereof. Drying times will be dependent on the specific method employed but are typically on the order of 30 seconds up to several minutes.

In some embodiments, a method of manufacturing an integrated device using a cleaning composition described herein can include the following steps. First, a layer of a photoresist is applied to a semiconductor substrate. The semiconductor substrate thus obtained can then undergo a pattern transfer process, such as an etch or implant process, to form an integrated circuit. The bulk of the photoresist can then be removed by a dry or wet stripping method (e.g., an oxygen based plasma ashing process). Remaining residues on the semiconductor substrate can then be removed using a cleaning composition described herein in the manner described above. The semiconductor substrate can subsequently be processed to form one or more additional circuits on the substrate or can be processed to form into a semiconductor chip by, for example, assembling (e.g., dicing and bonding) and packaging (e.g., chip sealing).

The contents of all publications cited herein (e.g., patents, patent application publications, and articles) are hereby incorporated by reference in their entirety.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

General Procedure 1

Formulation Blending

Samples of cleaning compositions were prepared by adding, while stirring, to the calculated amount of organic solvent the remaining components of the formulation. After a uniform solution was achieved, optional additives, if used, were added.

General Procedure 2

Cleaning Evaluation with Beaker Test

The cleaning of PER (Post Etch Residue) from a substrate was carried out with the described cleaning compositions using a multilayered semiconductor substrate of photoresist/TiOx/SiN/Co/ILD (ILD=Inter Layer Dielectric) or photoresist/TiOx/SiN/W/ILD that had been patterned lithographically, etched in a plasma metal etcher, and followed by oxygen plasma ashing to remove the top layer of photoresist completely.

The test coupons were held using 4" long plastic locking tweezers, whereby the coupon could then be suspended into a 500 ml volume beaker containing approximately 200 milliliters of the cleaning compositions of the present disclosure. Prior to immersion of the coupon into the cleaning composition, the composition was pre-heated to the desired test condition temperature (typically 40° C. or 70° C. as noted) with controlled stirring. The cleaning tests were then carried out by placing the coupon which was held by the plastic tweezers into the heated composition in such a way that the PER layer containing side of the coupon faced the stir bar. The coupon was left static in the cleaning composition for a time period (typically 2 to 5 minutes) while the composition was kept at the test temperature under controlled stirring. When the desired cleaning time was completed, the coupon was quickly removed from the cleaning composition and placed in a 500 ml plastic beaker filled with approximately 400 ml of DI water at ambient temperature (~17° C.) with gentle stirring. The coupon was left in the beaker of DI water for approximately 15 seconds, and then quickly removed, followed by a rinse in isopropanol for about 30 seconds. The coupon was immediately exposed to a nitrogen gas stream from a hand held nitrogen blowing gun, which caused any droplets on the coupon surface to be blown off the coupon, and further, to completely dry the coupon device surface. Following this final nitrogen drying step, the coupon was removed from the plastic tweezers holder and placed into a covered plastic carrier with the device side up for short term storage. The scanning electron microscopy (SEM) images were then collected for key features on the cleaned test coupon device surface.

General Procedure 3

Materials Compatibility Evaluation with Beaker Test

The blankets W on silicon substrate, TiOx on $SiO_2$ on silicon substrate, SiN on silicon substrate, $Al_2O_3$ on silicon substrate, TiN on silicon substrate, ILD on silicon substrate were diced into approximately 1 inch×1 inch square test coupons for the materials compatibility tests. The test coupons were initially measured for thickness or sheet resistance by the 4-point probe, CDE Resmap 273 for metallic film (Co, W), or by Elipsometry for dielectric film (TiOx, SiN and ILD) using a Woollam M-2000X. The test coupons were then installed on the 4" long plastic locking tweezers and treated as described in the cleaning procedure in General Procedure 3 with the Co, W, TiOx, SiN, or ILD layer containing side of the coupon faced the stir bar for 10 minutes.

After the final nitrogen drying step, the coupon was removed from the plastic tweezers holder and placed into a covered plastic carrier. The post-thickness or sheet resistance was then collected on the post-processing test coupon surface by the 4-point probe, CDE Resmap 273 for metallic film (Co and W) or by Elipsometry for dielectric film (TiOx, SiN and ILD) using a Woollam M-2000X.

Example 1

Formulation Examples 1-11 (FE-1 to FE-11) and Comparative Formulation Examples 1-16 (CFE-1 to CFE-16) were prepared according to General Procedure 1, and evaluated according to General Procedures 2 and 3. The formulations are summarized in Table 1 and the cleaning results and the etch rates (ER) (Angstroms/minute) of Co, W, AlOx, TiOx, and B-doped W are summarized in Table 2. The results in Table 2 were obtained at a cleaning temperature of 65° C. within a cleaning time of 3-6 minutes.

TABLE 1

| Ex. | HA | PG | MEA | pH Adjusting agent | IA or its salt | 5MBTA | Additive | DI Water | Total | PH |
|---|---|---|---|---|---|---|---|---|---|---|
| FE-1 | 10.00% | 44.35% | 9.25% | — | IAAS 0.90% | 0.50% | — | 35.00% | 100.00% | 10.6 |
| FE-2 | 10.00% | 48.60% | 5.00% | — | IAAS 0.90% | 0.50% | — | 35.00% | 100.00% | 10.3 |
| FE-3 | 10.00% | 41.35% | 7.00% | MSA 5.25% | IAAS 0.90% | 0.50% | — | 35.00% | 100.00% | 9.3 |
| FE-4 | 10.00% | 41.35% | 7.00% | MSA 5.25% | IA 0.90% | 0.50% | — | 35.00% | 100.00% | 9.3 |
| FE-5 | 10.00% | 44.10% | 7.00% | MSA 2.50% | IA 0.90% | 0.50% | — | 35.00% | 100.00% | 10.5 |
| FE-6 | 8.00% | 45.10% | 8.00% | MSA 2.50% | IA 0.90% | 0.50% | — | 35.00% | 100.00% | 10.6 |
| FE-7 | 10.00% | 41.75% | 7.00% | MSA 5.25% | IAAS 0.50% | 0.50% | — | 35.00% | 100.00% | 9.3 |
| FE-8 | 10.00% | 42.25% | 7.00% | MSA 5.25% | — | 0.50% | — | 35.00% | 100.00% | 9.3 |
| FE-9 | 10.00% | 41.77% | 7.00% | MSA 5.43% | IA 0.30% | 0.50% | — | 35.00% | 100.00% | 9.3 |
| FE-10 | 10.00% | 44.87% | 7.00% | HCl 1.73% | IAAS 0.90% | 0.50% | — | 35.00% | 100.00% | 9.3 |
| FE-11 | 10.00% | 36.35% | 7.00% | MSA 5.25% | IAAS 0.90% | 0.50% | — | 40.00% | 100.00% | 9.3 |
| CFE-1 | 4.00% | 58.92% | — | DBU 1.08% | IAAS 0.50% | 0.50% | — | 35.00% | 100.00% | 10.1 |
| CFE-2 | 6.00% | 56.93% | — | DBU 1.07% | IAAS 0.50% | 0.50% | — | 35.00% | 100.00% | 10.1 |
| CFE-3 | 8.00% | 54.92% | — | DBU 1.08% | IAAS 0.50% | 0.50% | — | 35.00% | 100.00% | 10.1 |
| CFE-4 | 4.00% | 58.52% | — | DBU 1.08% | IAAS 0.90% | 0.50% | — | 35.00% | 100.00% | 10.1 |
| CFE-5 | 6.00% | 56.53% | — | DBU 1.07% | IAAS 0.90% | 0.50% | — | 35.00% | 100.00% | 10.1 |
| CFE-6 | 8.00% | 54.52% | — | DBU 1.08% | IAAS 0.90% | 0.50% | — | 35.00% | 100.00% | 10.1 |
| CFE-7 | 10.00% | 52.13% | — | DBU 1.46% | IAAS 0.90% | 0.50% | $(NH_4)_2TiF_6$ 0.007% | 35.00% | 100.00% | 10.1 |
| CFE-8 | 10.00% | 52.87% | — | DBU 1.12% | IAAS 0.90% | 0.10% | $(NH_4)_2TiF_6$ 0.007% | 35.00% | 100.00% | 10.1 |
| CFE-9 | 10.00% | 52.87% | — | DBU 1.12% | IAAS 0.90% | 0.10% | $(NH_4)_2TiF_6$ 0.014% | 35.00% | 100.00% | 10.1 |
| CFE-10 | 10.00% | 52.67% | — | DBU 1.12% | IAAS 0.90% | 0.30% | $(NH_4)_2TiF_6$ 0.014% | 35.00% | 100.00% | 10.1 |
| CFE-11 | 10.00% | 52.37% | — | DBU 1.42% | IAAS 0.90% | 0.30% | $(NH_4)_2TiF_6$ 0.014% | 35.00% | 100.00% | 10.1 |
| CFE-12 | 10.00% | 31.59% | 18.50% | MSA 3.51% | IAAS 0.90% | 0.50% | — | 35.00% | 100.00% | 10.2 |
| CFE-13 | 10.00% | 51.10% | 2.50% | — | IAAS 0.90% | 0.50% | — | 35.00% | 100.00% | 10.1 |
| CFE-14 | 10.00% | 58.60% | 5.00% | — | IA 0.90% | 0.50% | — | 25.00% | 100.00% | 10.1 |
| CFE-15 | 10.00% | 61.60% | 4.00% | — | IA 0.90% | 0.50% | — | 25.00% | 100.00% | 10.0 |
| CFE-16 | 10.00% | 46.15% | 5.00% | MSA 2.45% | IAAS 0.90% | 0.50% | — | 35.00% | 100.00% | 9.6 |

HA = Hydroxylamine; PG = Propylene Glycol; MEA = Monoethanolamine; MSA = Methanesulfonic acid; IA = Isethionic acid; IAAS = Isethionic acid $NH_4$ salt; 5MBTA = 5-methylbenzothiazole; DBU = 1,8-diazabicyclo[5.4.0]-7-undecene.

TABLE 2

| Ex. | Co (Å/min) | W (Å/min) | AlOx (Å/min) | TiOx (Å/min) | B-doped W (Å/min) | Cleaning |
|---|---|---|---|---|---|---|
| FE-1 | N/A | N/A | 3.90 | N/A | N/A | Clean in 4 minutes |
| FE-2 | N/A | N/A | 2.90 | N/A | N/A | Clean in 4 minutes |
| FE-3 | N/A | N/A | 1.60 | N/A | N/A | Clean in 3.5 minutes |
| FE-4 | 0.6 | 4.2 | 1.0 | 0.4 | 60.3 | Clean in 3.5 minutes |
| FE-5 | 1.0 | 5.7 | 2.1 | 0.7 | 74.1 | Clean in 3.5 minutes |
| FE-6 | 0.7 | 4.8 | 1.8 | 0.5 | 68.5 | 85-90% Clean |
| FE-7 | 0.7 | 4.6 | 1.2 | 0.5 | 70.0 | Clean in 4 minutes |
| FE-8 | 0.9 | 5.8 | 2.2 | 1.0 | 95.5 | Clean in 4 minutes |
| FE-9 | N/A | N/A | 1.5 | N/A | N/A | Clean in 4 minutes |
| FE-10 | N/A | N/A | 1.7 | N/A | N/A | Clean in 3.5 minutes |
| FE-11 | N/A | N/A | 2.4 | N/A | N/A | Clean in 3.5 minutes |
| CFE-1 | N/A | N/A | N/A | N/A | N/A | Not clean in 6 minutes |
| CFE-2 | N/A | N/A | N/A | N/A | N/A | Not clean in 6 minutes |
| CFE-3 | N/A | N/A | N/A | N/A | N/A | Not clean in 6 minutes |
| CFE-4 | N/A | N/A | N/A | N/A | N/A | Not clean in 6 minutes |
| CFE-5 | N/A | N/A | N/A | N/A | N/A | Not clean in 6 minutes |
| CFE-6 | N/A | N/A | N/A | N/A | N/A | Not clean in 6 minutes |
| CFE-7 | N/A | N/A | N/A | N/A | N/A | 85-90% clean |
| CFE-8 | N/A | N/A | N/A | N/A | N/A | 85-90% clean |
| CFE-9 | N/A | N/A | N/A | N/A | N/A | 85-90% clean |

TABLE 2-continued

| Ex. | Co (Å/min) | W (Å/min) | AlOx (Å/min) | TiOx (Å/min) | B-doped W (Å/min) | Cleaning |
|---|---|---|---|---|---|---|
| CFE-10 | N/A | N/A | N/A | N/A | N/A | 85-90% clean |
| CFE-11 | N/A | N/A | N/A | N/A | N/A | 85-90% clean |
| CFE-12 | N/A | N/A | 8.91 | N/A | N/A | Clean in 4 minutes |
| CFE-13 | N/A | N/A | 1.86 | N/A | N/A | Not clean in 6 minutes |
| CFE-14 | 1.8 | 5.3 | 1.21 | 0.61 | 61.5 | Not clean in 6 minutes |
| CFE-15 | 0.8 | 4.9 | 1.02 | 0.49 | 55.2 | Not clean in 6 minutes |
| CFE-16 | N/A | N/A | 1.52 | N/A | N/A | Not clean in 6 minutes |

N/A = Not available.

As shown in Tables 1 and 2, formulations FE-1 to FE-11 (which contained appropriate amounts of monoethanolamine and isethionic acid or its salt) exhibited both excellent capability of cleaning post etch residues and compatibility (i.e., relatively low etch rates) with semiconductor materials (especially AlOx) that may be exposed in a cleaning process. By contrast, formulations CFE-1 to CFE-11 (which do not contain monoethanolamine) did not adequately clean post etch residues. Formulation CFE-12 contained a relatively high amount of monoethanolamine. Although formulation CFE-12 cleaned post etch residues, it exhibited a relatively high AlOx etch rate (i.e., a relatively low compatibility with AlOx). Formulations CFE-13 and CFE-15 contained a relatively low amount of monoethanolamine. The results showed that, although these two formulations exhibited a relatively low AlOx etch rate, they did not adequately clean post etch residues. Formulation CFE-14 contained a relatively low amount of DI water. The results showed that, although this formulation exhibited a relatively low AlOx etch rate, it did not adequately clean post etch residues.

Other embodiments are within the scope of the following claims.

What is claimed is:

1. A cleaning composition, comprising:
   1) at least one redox agent;
   2) at least one alkylsulfonic acid or a salt thereof, the alkylsulfonic acid comprising an alkyl group substituted by OH or $NH_2$;
   3) at least one aminoalcohol;
   4) at least one corrosion inhibitor;
   5) at least one organic solvent;
   6) water; and
   7) optionally, at least one pH adjusting agent.

2. The composition of claim 1, wherein the composition has a pH from about 8 to about 11.

3. The composition of claim 1, wherein the at least one alkylsulfonic acid comprises an alkylsulfonic acid of formula (I):

R—SO$_3$H     (I), in which R is $C_1$-$C_{10}$ alkyl substituted by at least one substituent selected from the group consisting of OH and $NH_2$.

4. The composition of claim 3, wherein R is $C_1$-$C_4$ alkyl substituted by at least one OH.

5. The composition of claim 1, wherein the at least one alkylsulfonic acid or a salt thereof comprises HO(CH$_2$)$_2$SO$_3$H or HO(CH$_2$)$_2$SO$_3$NH$_4$.

6. The composition of claim 1, wherein the at least one alkylsulfonic acid or a salt thereof is from about 0.3% by weight to about 5% by weight of the composition.

7. The composition of claim 1, wherein the at least one redox agent comprises hydroxylamine.

8. The composition of claim 1, wherein the at least one redox agent is from about 6% by weight to about 15% by weight of the composition.

9. The composition of claim 1, wherein the at least one aminoalcohol comprises ethanolamine or 2-(2-aminoethoxy)ethanol.

10. The composition of claim 1, wherein the at least one aminoalcohol is from about 5% by weight to about 10% by weight of the composition.

11. The composition of claim 1, wherein the at least one corrosion inhibitor comprises benzotriazole optionally substituted by at least one substituent selected from the group consisting of alkyl groups, aryl groups, halogen groups, amino groups, nitro groups, alkoxy groups, and hydroxyl groups.

12. The composition of claim 1, wherein the at least one corrosion inhibitor comprises a compound selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methylbenzotriazole, benzotriazole-5-carboxylic acid, 4-m ethylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

13. The composition of claim 1, wherein the at least one corrosion inhibitor is from about 0.1% by weight to about 2% by weight of the composition.

14. The composition of claim 1, wherein the composition comprises the at least one pH adjusting agent and the at least one pH adjusting agent comprises an acid.

15. The composition of claim 1, wherein the composition comprises the at least one pH adjusting agent and the at least one pH adjusting agent is from about 1% by weight to about 10% by weight of the composition.

16. The composition of claim 1, wherein the at least one organic solvent comprises a solvent selected from the group consisting of water soluble alcohols, water soluble ketones, water soluble esters, and water soluble ethers.

17. The composition of claim 1, wherein the at least one organic solvent comprises a solvent selected from the group consisting of alkylene glycols and alkylene glycol ethers.

18. The composition of claim 1, wherein the at least one organic solvent is from about 30% by weight to about 50% by weight of the composition.

19. The composition of claim 1, wherein water is from about 20% by weight to about 50% by weight of the composition.

20. A method, comprising:
   contacting a semiconductor substrate containing post etch residues or post ashing residues with a cleaning composition of claim 1.

21. The method of claim 20, wherein the semiconductor substrate further comprises at least one material selected from the group consisting of Cu, Co, W, AlOx, AlN, AlOxNy, Ti, TiN, Ta, TaN, TiOx, ZrOx, HfOx, and TaOx.

22. The method of claim 20, further comprising rinsing the semiconductor substrate with a rinse solvent after the contacting step.

23. The method of claim 22, further comprising drying the semiconductor substrate after the rinsing step.

24. The method of claim 20, further comprising forming a semiconductor device from the semiconductor substrate.

\* \* \* \* \*

UNITED STATES PATENT AND TRADEMARK OFFICE
CERTIFICATE OF CORRECTION

PATENT NO. : 10,752,867 B2
APPLICATION NO. : 16/278875
DATED : August 25, 2020
INVENTOR(S) : Thomas Dory et al.

Page 1 of 1

It is certified that error appears in the above-identified patent and that said Letters Patent is hereby corrected as shown below:

In the Claims

Column 16
Line 29, in Claim 12, delete "4-m ethylbenzotriazole," and insert -- 4-methylbenzotriazole, --
Line 37, in Claim 12, delete "5-t-butyl benzotriazole," and insert -- 5-t-butylbenzotriazole, --
Line 38, in Claim 12, delete "diimethylpropyl)" and insert -- dimethylpropyl) --
Line 39, in Claim 12, delete "5-n-octyl benzotriazole," and insert -- 5-n-octylbenzotriazole, --

Signed and Sealed this
Twentieth Day of October, 2020

Andrei Iancu
*Director of the United States Patent and Trademark Office*